(12) United States Patent
Bentley et al.

(10) Patent No.: US 8,519,048 B2
(45) Date of Patent: Aug. 27, 2013

(54) FORMATION OF SOLID LAYERS ON SUBSTRATES

(71) Applicant: Conductive Inkjet Technology Limited, West Yorkshire (GB)

(72) Inventors: Philip Gareth Bentley, Cambridge (GB); James Edward Fox, Cambridge (GB); Alan Lionel Hudd, Hertfordshire (GB); Martyn John Robinson, Cambridge (GB)

(73) Assignee: Conductive Inkjet Technology Limited, West Yorksire (GB)

( * ) Notice: Subject to any disclaimer, the term of this patent is extended or adjusted under 35 U.S.C. 154(b) by 0 days.

(21) Appl. No.: 13/652,090

(22) Filed: Oct. 15, 2012

(65) Prior Publication Data

US 2013/0040154 A1 Feb. 14, 2013

Related U.S. Application Data

(60) Division of application No. 11/002,646, filed on Dec. 3, 2004, now Pat. No. 8,435,603, which is a continuation-in-part of application No. 10/975,499, filed on Oct. 29, 2004, now abandoned.

(60) Provisional application No. 60/540,223, filed on Jan. 28, 2004, provisional application No. 60/527,948, filed on Dec. 8, 2003.

(30) Foreign Application Priority Data

| Dec. 5, 2003 | (GB) | ................................... 0328221.7 |
| Jan. 28, 2004 | (GB) | ................................... 0401825.5 |
| Oct. 29, 2004 | (WO) | ................. PCT/GB2004/004589 |

(51) Int. Cl.
*C08L 31/00* (2006.01)
*B05D 1/38* (2006.01)

(52) U.S. Cl.
USPC ........ 524/556; 427/333; 427/407.1; 427/437; 427/443; 427/508

(58) Field of Classification Search
USPC ............... 524/556; 427/333, 407, 437, 443.1
See application file for complete search history.

(56) References Cited

U.S. PATENT DOCUMENTS

| | | | |
|---|---|---|---|
| 3,637,559 A | 1/1972 | Pinkney | |
| 3,794,494 A | 2/1974 | Kai et al. | |
| 3,900,320 A | 8/1975 | Rolker et al. | |
| 4,910,072 A | 3/1990 | Morgan et al. | |
| 5,045,436 A | 9/1991 | Tieke et al. | |
| 5,082,734 A | 1/1992 | Vaughn et al. | |
| 5,098,696 A | 3/1992 | Montgomery | |
| 5,411,795 A | 5/1995 | Silverman | |
| 5,510,139 A | 4/1996 | Deissner et al. | |
| 5,751,325 A | 5/1998 | Leenders et al. | |
| 5,985,785 A * | 11/1999 | Lane et al. | ................. 502/159 |
| 5,989,653 A | 11/1999 | Chen et al. | |
| 6,014,929 A | 1/2000 | Teng | |
| 6,300,388 B1 | 10/2001 | Verdonck et al. | |
| 6,720,029 B2 | 4/2004 | Fujita et al. | |
| 7,422,708 B2 | 9/2008 | Kunze et al. | |

FOREIGN PATENT DOCUMENTS

| EP | 0256395 A2 | 7/1987 |
| EP | 0696515 A1 | 2/1996 |
| EP | 1375595 A1 | 1/2004 |
| JP | 6-17255 A | 1/1994 |
| JP | 2002-322565 A | 11/2002 |
| WO | 92/21790 A1 | 12/1992 |
| WO | 02/059209 A1 | 8/2002 |
| WO | 03/091477 A1 | 11/2003 |

* cited by examiner

*Primary Examiner* — Michael M Bernshteyn
(74) *Attorney, Agent, or Firm* — Morgan, Lewis & Bockius LLP

(57) ABSTRACT

Disclosed is a method of forming on the surface of a substrate a first solid layer which is suitable for activating a chemical reaction to form a second layer thereon, the method comprising the steps of: applying to the surface of the substrate a first liquid comprising a curable composition and an activator for the second layer-forming chemical reaction; and curing the curable composition, thereby forming a first solid layer adhered to the surface of the substrate, capable of activating the second layer-forming chemical reaction. A second layer can then be formed on the substrate by bringing into contact with the first solid layer a second fluid comprising components of a second layer-forming chemical reaction, activated by the activator, thereby causing a second layer to be formed on the first solid layer.

20 Claims, No Drawings

FORMATION OF SOLID LAYERS ON SUBSTRATES

FIELD OF THE INVENTION

The invention relates to formation of layers on substrates, particularly, but not exclusively, the formation of conductive metal regions on substrates by the reduction of metal ions.

BACKGROUND TO THE INVENTION

There are numerous industrial applications in which it is desirable to form a solid layer of a material on the surface of a substrate. For example, it is desirable to form a conductive metal layer in applications as diverse as the manufacture of printed circuit boards, aerials, and antennae such as those found in mobile telephones, radio frequency identification devices (RFIDs), smart cards, contacts for batteries and power supplies, arrays of contacts for flat screen technologies (liquid crystal displays, light emitting polymer displays and the like), electrodes for biological and electrochemical sensors, smart textiles and decorative features.

In this specification, unless the context requires otherwise, the adjective solid, in the context of a solid layer, or solid substrate, refers to being in the solid (rather than liquid or gas) phase of matter. A solid layer or substrate may be plastic, elastic, resilient, rigid, gelatinous, permeable or have any other property consistent with being solid phase.

In some of these applications, the solid layer that is formed covers the surface. In other applications, the solid layer is patterned, and the accuracy and fineness of detail of the pattern can be important. For example, printed circuit boards may have intricate patterns of copper conductive tracks. Accuracy and fineness of detail is important in determining the extent of miniaturisation possible on such printed circuit boards, and the reliability of the electronic circuits built thereon.

Some methods of forming a solid layer on a surface of a substrate require a catalyst, or other activator. For example, the electroless plating process is a solution chemistry plating technique which has been used for many years to apply a conductive metal coating layer to a substrate surface, which can be flat or shaped. In the electroless process, a substrate is immersed in a succession of baths in turn.

An example of the electroless process used to form a copper layer on the surface of a substrate would be as follows:

Firstly, a plastics substrate is etched in a chromic acid/concentrated sulphuric acid bath at 68±2° C. to microscopically etch the surface of the plastics substrate, ensuring good adhesion of the copper to the surface of the plastics substrate.

Secondly, any hexavalent chromic species left on the plastics substance are neutralised in a bath comprising approximately 30% concentrated hydrochloric acid at around 50° C. The plastics substrate is then added to a third bath in which an activator is added to prepare the plastics substrate surface to absorb the catalyst in the next step. This third bath is typically approximately 30% concentrated hydrochloric acid, at room temperature.

Next, the plastics substrate is dipped into a fourth bath, which includes a dilute solution of a palladium colloid along with tin salts. A colloid deposits on the surface of the plastics material to catalyse the deposition of copper in the subsequent plating steps. This bath includes a high proportion of tin salts, approximately 30% concentrated hydrochloric acid, and is operated at room temperature.

The fifth bath into which the plastics substrate is dipped includes an accelerator which activates the absorbed palladium, improving the speed and uniformity of deposition. Accelerator baths include around 30% concentrated hydrochloric acid.

Finally, the activated plastics substrate is dipped into a sixth bath including a plating solution which, catalysed by the palladium colloid on the plastics substrate, causes copper to deposit onto areas of the plastics substrate which were coated with the catalyst. The plating solution includes a copper salt, formaldehyde as a reducing agent, and sodium hydroxide to activate the formaldehyde. The composition of the plating solution must be carefully temperature controlled, with a temperature of 45±2° C. being appropriate for some commercially applicable compositions.

In the above example chemistry, the catalyst is required for formation of the copper layer, and the acid pre-treatment step is important as it helps the resulting metal layer adhere to the substrate.

Various alternatives to this chemistry are known.

For example, WO 2004/068389 describes a method of forming a conductive metal region on a substrate, comprising depositing on the substrate a solution of a metal ion, and depositing on the substrate a solution of a reducing agent, such that the metal ion and the reducing agent react together in a reaction solution to form a conductive metal region on the substrate. In some embodiments, a catalyst or other activator is required to start the reaction which forms the conductive metal region. In general, a catalyst is applied to a substrate surface, which is then brought into contact with the chemical composition which reacts, catalysed by the catalyst, to deposit a metal on the surface of the substrate.

It is known to deposit on a substrate, e.g by inkjet printing, a catalyst for a metal-forming reaction, with the catalyst applied in a solution containing a polymeric binder. See, for example, WO 02/099162 which discloses use of binders such as ethyl cellulose.

U.S. Pat. No. 6,495,456 discloses formation of electrodes on a chip substrate by a process that involves applying a photo-active catalyst liquid (of unspecified composition) to a chip substrate, irradiating the substrate with light to activate irradiated portions of the liquid (possibly selectively, e.g. using a mask) and then using electroless plating to form metal on the activated portions.

It is known to use ultra violet radiation and other means to reduce palladium acetate deposited on a substrate to palladium metal, followed by electroless plating of copper. Reduction may be performed selectively, by use of a contact mask, to produce patterned catalyst. Alternatively, palladium produced by infra red treatment may be patterned by excimer laser ablation using a metal contact mask. See Zhang et al "VUV light-induced decomposition of palladium acetate films for electroless copper plating" Applied Surface Science 109/110 (1997) 487-492 and Esrom "Fast selective metal deposition on polymers by using IR and excimer VUV photons" Applied Surface Science 168 (2000) 1-4.

U.S. Pat. No. 3,900,320 discloses a process for metallizing a plastic or ceramic base. A pre-plate solution comprising a compound of catalytic metal, such as a palladium salt, binder material such as one or more polymers and solvent are coated on the base and dried so as to form a thin polymer layer of about 20 Angstrom to about 3000 Angstrom thick which may thereafter be directly plated by contact with an electroless plating solution. The pre-plate solution has specified viscosity characteristics and specified high concentration levels of catalytic metal compound. A photosensitive polymer former can be used as a component of the pre-plate solution specifically for photographically developing a plateable pattern on a substrate such as a circuit board, printing plate or the like.

SUMMARY OF THE INVENTION

In accordance with the invention there is provided a method of forming, on the surface of a substrate, a first solid layer which is capable of activating a chemical reaction to form a second layer thereon, the method comprising bringing into contact the substrate surface and a first liquid comprising a curable composition and an activator for said second layer-forming chemical reaction; and curing the curable composition to increase adhesion of the material to the surface of the substrate, thereby forming a first solid layer adhered to the surface of the substrate, capable of activating said second layer-forming chemical reaction after contact with a second fluid.

A curable composition is one which can undergo a chemical change resulting in hardening, preferably solidification. The hardening process improves adhesion of the material and results in formation of a solid layer (the first solid layer), that may be rigid, plastic, elastic, resilient, gelatinous, permeable or have any other property consistent with being in the solid phase, as opposed to liquid or gas. The solid layer may include regions in liquid or gaseous form.

The curable composition is such that the resulting first solid layer adheres to the substrate, and so is selected having regard to the substrate. Adhesion can arise through chemical bonding, physical bonding, mechanical bonding or a mixture thereof. Use of a curable composition can result in improved adhesion to a wider variety of different substrates than is possible with non-curable catalytic solutions of the prior art.

The curable composition is brought into contact with the substrate surface while the composition is in liquid form, and is subsequently cured. Curing typically takes place while the curable composition is still in liquid form, although the curable composition may instead be converted to solid form, e.g. by drying, prior to curing.

The activator is typically incorporated in the first solid layer, whether by entrapment, immobilisation or other means, and is typically dispersed throughout the first solid layer within a matrix formed by the cured composition. The activator is thus adhered with respect to the substrate by virtue of its inclusion in the first layer.

The curable composition typically comprises one or more component chemicals which can undergo a reaction resulting in hardening, preferably solidification.

Preferably, the curable composition comprises one or more monomers and/or oligomers which can polymerize and/or cross-link in use, thereby hardening and forming a solid layer. Preferably, the resulting product forms a matrix, typically a polymer matrix, which includes the activator. A curable composition including at least some oligomers will often have lower toxicity than if only monomers were included. The presence of at least some oligomers can also result in production of a first layer having improved physical properties such as flexibility, hardness and abrasion-resistance.

The curable composition is curable in response to appropriate curing conditions. For example, the composition may be curable in response to a stimulus, such as electromagnetic radiation of a particular wavelength band (e.g. ultra-violet, blue, microwaves, infra-red), electron beams, or heat. The composition could instead be curable in response to appropriate chemical conditions, particularly the presence of a chemical curing agent or hardener: in this case a "two pack" approach may be adopted, with one chemical component applied in the first liquid and a second chemical component separately applied (simultaneously or subsequently). As a further possibility the composition may be curable in response to the presence of species such as moisture or air.

Preferably, the curable composition is selected to undergo a reaction responsive to one or more of the above stimuli. An ultra-violet curable composition is currently preferred.

It is preferred to use a first liquid such that no significant or substantial heating is required. This means that the method of the invention can be used with a wide range of substrates, including heat-sensitive plastics materials. In particular, it is preferred that the first layer is formed at temperatures below about 300° C. (allowing the use of polyimide substrates), desirably below about 200° C. (allowing the use of polyester substrates such as Teonex (Teonex is a Trade Mark)), more desirably below about 100° C. (allowing use of a wide range of thermoplastic substrates), yet more desirably below about 50° C. (allowing use of low Tg substrates) and possibly at room temperature, avoiding the need for heating. Heating, if required, is only applied for a relatively short time, typically less than 15 minutes and preferably less than about 2 minutes for processing efficiency.

Typically, the curable composition comprises one or more monomers and/or oligomers which can form a polymer, and an initiator which starts a polymerisation reaction responsive to a stimulus, as discussed above. Suitable initiators are well known to those skilled in the art. For example, benzoyl peroxide, lauroyl peroxide, azobis-(1-hydroxycyclohexane) or AIBN (2,2'-azobisisobutyronitrile) (all from Polysciences, Inc., USA) can be included to initiate a polymerisation reaction responsive to heat. Darocur 1173 (2-hydroxy-2-methyl-1-phenyl-propan-1-one), Irgacure 184 (1-hydroxy-cyclohexyl-phenyl-ketone), Irgacure 369 (2-benzyl-2-dimethylamino-1-(4-morpholinophenyl)-butanone-1), Irgacure 651 (2,2-dimethoxy-1,2-diphenylethan-1-one), Irgacure 2959 (1-[4-(2-hydroxyethoxy)-phenyl]-2-hydroxy-2-methyl-1-propane-1-one), Irgacure 819 and Irgacure 1700 (Darocur and Irgacure are Trade Marks) are examples of UV photo-initiators, available from Ciba Specialty Chemicals, Manchester, UK and Basel, Switzerland. Typically, such initiators generate free radicals responsive to a stimulus. Other curing processes can be used, such as cationic curing of materials such as epoxys, vinyl ethers and vinyl esters, where an initiator generates cations responsive to a stimulus.

Conveniently, the monomers and/or oligomers are those known from the field of UV curable inks, or other curable inks, proposed for inkjet printing of curable inks. Suitable UV-curable materials include acrylates and methacrylates, particularly those included in the following list classified by the number of cross-linkable functional groups:

Monofunctional
Isobornylacrylate (IBOA), e.g. as SR506D
Octyl decyl acrylate (ODA), e.g. as SR484
Caprolactone acrylate, e.g. as SR495
Lauryl acrylate, e.g. as SR335
Difunctional
Tripropylene glycol diacrylate (TPGDA), e.g. as Actilane 424
1,6-hexanediol diacrylate (HDDA), e.g. as Actilane 425
Dipropylene glycol diacrylate (DPGDA), e.g. as SR508
Propoxylated(2) neopentyl glycol diacrylate (PONPGDA), e.g. as SR9003
Tricyclodecanedimethanol diacrylate (TCDDMDA), e.g. as SR833S
Polyethylene glycol 400 diacrylate (PEG400DA), e.g. as SR344
Trifunctional
Trimethylol propane triacrylate (TMPTA), e.g. as Actilane 431
Ethoxylated(3)trimethylol propane triacrylate, e.g. as SR454
Ethoxylated(6)trimethylol propane triacrylate, e.g. as SR499
Tetrafunctional Actilane 505 (a tetrafunctional polyester acrylate oligomer)
Ethoxylated pentaerythritol tetraacrylate (PPTTA), e.g. as Actilane 440
Ditrimethylolpropane tetraacrylate (di TMPTA), e.g. as Actilane 441
Hexafunctional
Dipentaerythritol hexaacrylate (DPHA), e.g. as Actilane 450

The Actilane range is available from Akzo Nobel, The Netherlands. Actilane is a Trade Mark.

The SR range is available from Sartomer, USA.

All of the above acrylates cure in response to free radicals, e.g. generated from an initiator such as Irgacure 819 and Irgacure 1700. All of the above acrylates are in the form of liquids, although it is instead possible to use solid monomers and/or oligomers.

It is preferred that some (but not all) of the monomers and/or oligomers have at least 3 cross-linkable functional groups, e.g. being selected from the trifunctional, tetrafunctional and hexafunctional materials listed above. Use of such materials results in production of polymers that are more highly cross-linked than polymers formed from monomers and/or oligomers with fewer cross-linkable functional groups, and can provide a stronger, more robust film with better adhesion to the substrate. Too high a proportion of such highly cross-linkable monomers and/or oligomers (having at least 3 cross-linkable functional groups) would, however, tend to form a brittle surface and so should be avoided. In addition, use of too high a proportion of such highly cross-linkable materials would tend to produce a curable composition of too high viscosity to be suited to inkjet printing.

In general, the higher the number of cross-linkable functional groups, the higher the viscosity of the monomer/oligomer and so the smaller proportion of the monomer/oligomer it is appropriate to use. As an approximate guide, trifunctional materials should not exceed about 75% by weight of the total monomer/oligomer content of the first liquid, tetrafunctional materials should not exceed about 35% by weight of the total monomer/oligomer content or the first liquid, and hexafunctional materials should not exceed about 10% by weight of the total monomer/oligomer content of the first liquid.

The method conveniently includes formation of the second layer on the first solid layer. The method thus preferably further comprises bringing into contact the first solid layer and a second fluid that comprises one or more reagents for a chemical reaction, activated by the activator, to form the second layer. The second fluid contacts the activator in the first layer, and reacts to form the second layer on the first solid layer.

The first solid layer need not necessarily finish curing before the second fluid is applied.

The second layer of material is typically solid and is conveniently a conductive metal layer, which may be formed by a variety of different processes involving the activator in the first layer. The processes typically involve the reduction of metal ions, and include electroless plating, as referred to above, and the process disclosed in WO 2004/068389.

The improved adhesion of the first layer to the substrate surface made possible by the invention, as noted above, results in improved adhesion of such a conductive metal layer, and makes it possible to produce a thicker layer of metal, e.g. copper, without blistering or peeling of the layer from the substrate.

As the activator is located in a layer on the surface of the substrate, the second reaction, e.g. metallisation, will generally occur on or in the first layer in preference to reaction, e.g. the formation of fine particles of metal, in the second fluid.

The second fluid may be in the form of one or more components, that may be applied to the first solid layer simultaneously or sequentially.

The first layer need not be directly adhered to the substrate surface: there may be one or more intervening layers. Further, the second layer need not be the top or final layer: one or more further layers may be formed thereon.

The method of the invention allows greater choice of substrate for a given second layer, and vice versa, than would otherwise be possible. By selecting an appropriate first liquid, such that the first solid layer adheres well to the substrate and the second layer adheres well to the first solid layer, the second layer may in some cases be more securely affixed with respect to the substrate than if the second solid layer were adhered directly to the substrate. This can allow a greater choice of substrate for a given second layer and/or allows a thicker second layer to be formed than would be the case if the activator were applied by a different technique.

The activator is preferably a catalyst, such as palladium for catalysing a metallisation reaction. However, the activator could instead comprise a chemical species which can activate the second layer forming chemical reaction, but is consumed or reacts in the process, and so is not strictly speaking a catalyst.

The activator may alternatively comprise a reagent, or a plurality of reagents which, when brought into contact with a second fluid comprising components (preferably other components) of a second solid-layer-forming chemical reaction, undergo a chemical reaction leading to formation of a second layer on the first solid layer.

The activator may be applied in precursor form. In this case, the method may include the further step of chemically converting the one or more precursor reagents to an active or catalytic form. For example, palladium acetate may be reduced in situ by a subsequently applied reducing agent solution, forming palladium metal which can catalyse deposition of metal thereon when an appropriate second fluid is applied.

The first solid layer may coat most or all of the entire substrate surface. Alternatively, the first solid layer may be formed on the substrate according to a pattern. This may be achieved in several ways. For example, the first liquid may be deposited according to a pattern, e.g. by printing in the desired pattern, particularly by inkjet printing. Alternatively, the first solid layer may be patterned after the first liquid has been deposited; for example, the first liquid may be applied extensively across the substrate, selectively cured according to a pattern and uncured liquid may then be removed. Selective curing according to a pattern can be achieved by use of a mask, such as a shadow mask for liquid or solid layers or a contact mask for solid layers, to limit exposure to a stimulus as discussed above, e.g. UV radiation. Laser writing (using a laser of appropriate wavelength for a particular initiator) and electron beam writing can also be used. With electron beam writing, a photoinitiator is not required, and this approach can be used to create patterns with very fine features, of the order of 10 nm. As a further possibility, when using chemical curing, a curing agent or hardener may be selectively applied according to a desired pattern. In all cases, excess (uncured) material may be removed by techniques including washing, spraying or immersion in suitable reagents such as an acid, alkali or solvent or by physical means such as use of an air knife.

Thus, the use of a curable composition can allow patterning to an extent which would not be possible were the activator deposited on the substrate as a liquid which remained soft and flowed.

The first liquid can be applied extensively to a substrate surface by a wide range of possible techniques, including using printing, dipping, spraying and spinning techniques such as jet printing, inkjet printing, spin coating, dip coating, spray coating, aerosol spraying, roller coating, curtain coating, screen printing, litho printing, flexo printing, gravure printing and pad printing, or by any other liquid application technique.

Preferably, the first liquid is brought into contact with the substrate by a deposition process, for example a printing process. Preferably, the deposition process is a non-contact process that is preferably digital e.g. inkjet printing. The first liquid is preferably applied as a single liquid, e.g. by inkjet printing from a single liquid reservoir.

Printing processes typically result in production of a first solid layer having a thickness greater than 300 nm and possibly significantly thicker.

The first liquid is typically in the form of a solution, preferably a partially or entirely non-aqueous solution, but may alternatively be in the form of a suspension or dispersion with one or more components in solid or colloidal form, or an emulsion. Different ingredients of the first liquid may be present in different forms. The first liquid generally includes a carrier liquid (which may function as a solvent e.g. for the activator), which is preferably partially or entirely non-aqueous. Preferred non-aqueous liquids are discussed below. The carrier liquid may be constituted by one or more curable monomers and/or oligomers, e.g. as discussed above, if in liquid form, or may be constituted by a separate liquid (not part of the curable composition) performing a carrier function only.

The second fluid is preferably in liquid form, and so is a second liquid.

The second liquid may be in the form of a solution, preferably an aqueous solution, but may alternatively be in the form of a suspension or dispersion with one or more components in solid or colloidal form, or an emulsion. The second liquid thus generally includes a carrier liquid (which may function as a solvent). The carrier liquid of the second liquid preferably comprises water.

The first liquid desirably includes a carrier liquid that is sufficiently aggressive to the substrate to allow the first liquid to penetrate therein, with the carrier liquid partially dissolving or otherwise permeating into the substrate, increasing adhesion of the first solid layer to the substrate, and thus also increasing the adhesion of the second layer to the substrate (via the first solid layer).

The first liquid and the second liquid preferably comprise different carrier liquids. This allows the carrier liquid of the first liquid to be selected to be appropriate for the formation of the first layer and the adhesion of the first layer to the substrate, whilst the carrier liquid of the second liquid can be selected to be appropriate for the formation of the second layer. Preferably, the carrier liquid of the second liquid is water. Thus, aqueous metallisation chemistry and a non-aqueous first stage can be utilised in different steps of the same process. Preferably, the carrier liquid of the first liquid is partially or entirely non-aqueous.

Typically, print quality and adhesion are governed predominantly by the properties of the first liquid and the first solid layer which it forms. Thus, to some extent, the invention allows the first liquid to be selected dependent on the patterning quality required and the second fluid to be selected dependent on the desired properties of the second layer. This can allow greater flexibility in designing appropriate first liquid and second fluid chemistries for a particular application.

The first liquid may be selected to have improved wetting properties on one or more substrates as compared with those of the second fluid. This allows more accurate and precise patterning than if the first liquid was applied from the same carrier liquid (e.g. water) as the second fluid, with fine features and better edge definition being possible. There will typically be less bleed and feathering of the first liquid than if activator were applied to the surface by a different technique using a carrier with poorer wetting properties. Improved wetting properties allow more accurate and precise patterning as successive spots of liquid along a line can be deposited further apart (by a technique such as inkjet printing) allowing a lower volume of liquid to be used, and thus narrower lines and finer features to be prepared.

This use of the first liquid comprising an activator is particularly beneficial when using inkjet printing to deposit a material on a substrate. Many curable liquids have an appropriate viscosity to be suitable to be inkjet printed, giving good print head performance. Suitable viscosities for inkjet printing liquids are typically in the range 1 to 20 cPs at print head operating temperature.

The process may be repeated (optionally with different first liquids and second fluids) to build up a multi-layer structure.

The first solid layer preferably includes a first chemical functionality which is at least partially insoluble in the second fluid, as disclosed in our International Application PCT/GB2004/004589. This means that the physical integrity of the first layer is maintained on contact with the second fluid and while the second layer is formed. This has the consequence of improving adhesion of the second layer with respect to the substrate surface. The first chemical functionality need not be completely insoluble in the second fluid, but merely sufficiently insoluble to achieve this effect. Thus, the first chemical functionality only needs to be sufficiently insoluble in the second fluid to retain the integrity of the first layer while the second layer is formed.

The second fluid is preferably aqueous, as noted above, so the first chemical functionality is preferably at least partially insoluble in water. The first chemical functionality may be present in the first liquid, and also in the first layer, or may be formed, e.g. by cross-linking, in the first layer from reactants (that are possibly soluble in the second fluid) in the first liquid. The first chemical functionality is preferably non-ceramic. The first chemical functionality is preferably at least predominantly or fully organic and/or silicon based, comprising at least 50% by weight of organic and/or silicon materials, for improved adhesion to a wide range of organic substrates such as plastics substrates. The first chemical functionality may absorb the second fluid and swell. The first chemical functionality may be constituted by the reaction product of the curable composition, e.g. one or more curable monomers and/or oligomers in the first liquid. Such materials may be included in the first liquid and react to form a polymer in the first layer with appropriate solubility properties. The polymer product also has good adhesion to a very wide range of substrates, including metals, glass, ceramics and plastics materials. Thus, the first liquid preferably includes one or more ingredients that constitute or form the first chemical functionality in the first layer.

Preferably, the components of the first liquid are selected so that the first solid layer is permeable to the second fluid when the second fluid is brought into contact with the first solid layer, as disclosed in our International Application PCT/GB2004/004589. We have found that this can substantially improve the effective activation/catalytic activity of the first solid layer. In particular, the second fluid can penetrate the first solid layer, allowing the second fluid to access the activator within the first solid layer. The second layer-forming reaction can thus take place on, or in close proximity to, the substrate surface, producing the desired second layer of material on the substrate. Furthermore, penetration of the second fluid into the first solid layer may result in the second layer of material intermingling with the first solid layer, thereby enhancing adhesion of the second layer of material to the substrate via the adhered first solid layer and improving through layer conductivity (where the second layer is conductive from its top surface down to the surface of the substrate).

The first layer thus preferably comprises a second chemical functionality which is at least partially soluble, miscible or swellable in the second fluid or permeable to the second fluid, as disclosed in our International Application No. PCT/GB2004/004589. The second fluid is preferably aqueous, as noted above, so the second chemical functionality is preferably at least partially soluble or swellable in water or permeable to water. The second chemical functionality may be present in the first liquid, and also the first layer, or may be formed in the first layer from reactants in the first liquid. Suitable second chemical functionalities are discussed below, and include polyvinylpyrrolidone (PVP), which is soluble in water, and which may be included as an ingredient of the first liquid. The second chemical functionality will at least partially dissolve or swell in, or be permeable to, the second fluid, allowing the fluid to penetrate the first solid layer and contact the activator. The first chemical functionality retains sufficient integrity to adhere to the substrate and the second layer, resulting in a "sponge-like" structure. This has the consequence of permitting enhanced access to the activator than would otherwise be the case, allowing the use of lower concentrations of activator, with consequential cost savings. In particular it is possible to use a first liquid with a weight ratio of curable composition to activator of greater than about 15:1, preferably greater than about 25:1. The ability to be able to use relatively low proportions of activator in the first liquid has the benefit of allowing greater freedom in formulation of the first liquid, e.g. in terms of properties such as viscosity and solvent choice.

Thus, the first liquid may comprise one or more ingredients which constitute or form in the first layer a second chemical functionality which is at least partially soluble, miscible or swellable in the second fluid or permeable to the second fluid. One preferred second chemical functionality is polyvinylpyrrolidone (PVP), which is soluble in water. Alternatives include polyacrylic acid, polyvinyl acetate, polyethylene imine, polyethylene oxide, polyethylene glycol, gelatin or copolymers thereof. The soluble components may dissolve when the second fluid is brought into contact with the first solid layer. For example, the polyvinylpyrrolidone will dissolve in contact with an aqueous solution of metal ion and reducing agent usable to form a conductive metal region on the first solid layer (see below). Around 5% by weight of polyvinylpyrrolidone in the resulting solid layer is appropriate.

The first liquid could instead (or as well) comprise a water swellable monomer and/or oligomer such as HEMA (2-hydroxyethyl methacrylate), GMA (glyceryl methacrylate) or NVP (n-vinyl pyrrollidinone). Other monomers and/or oligomers which are themselves swellable in the second fluid and/or are swellable when polymerised could be used instead. This allows the second fluid to permeate into the first solid layer, improving adhesion and allowing access to more activator than just activator present on the surface of the first solid layer.

The first liquid could instead (or as well) comprise a high boiling point solvent miscible with the second liquid, with the high boiling point solvent remaining in liquid form in the first solid layer. For example, NMP (n-methylpyrrolidinone) could be used when the second liquid is aqueous. This keeps the first layer matrix open allowing penetration by the second liquid and improving the adhesion of the second layer to the first solid layer. Other suitable solvents include ethylene glycol, diethylene glycol or glycerol.

The first liquid could instead (or as well) comprise microporous particles to create a micro-porous film structure. Micro-porous particles could be organic (e.g. PPVP (poly (polyvinylpyrrolidone))) or inorganic (e.g. silica).

The weight ratio of the first chemical functionality to the second chemical functionality is preferably greater than about 5:1, more preferably greater than about 10:1, most preferably greater than about 15:1. The use of relatively large amounts of the first chemical functionality results in benefits of improved adhesion to the substrate surface, more rapid curing, durability of the resulting first solid layer, and improved formulation flexibility for the first liquid.

The first liquid may include a carrier liquid which is volatile and which evaporates off, partially or fully, after application to the substrate. For example, the first liquid may comprise water or (preferably) one or more organic solvents which, in use, are evaporated off before the second fluid is brought into contact with the first layer. The method in this case may include a pause to allow a volatile carrier to evaporate before one or both of applying a stimulus (if applicable) and bringing the second fluid into contact with the first layer. It may be advantageous for some of the carrier liquid to remain in the first solid layer in liquid form, to keep the first layer matrix open.

Preferably, however, no significant delay between depositing and curing the first liquid is required, and there is no need for drying or pre-curing steps. This reduces over-wetting of the substrate, which causes loss of definition to the image. Preferably the delay between deposition and curing is 20 seconds or less. Further, the curing process itself can be achieved very rapidly, typically in less than 1 second, with benefits of control of image quality.

Where the carrier liquid is constituted by liquid monomers/oligomers, substantially all of the constituents of the first liquid may remain in the first solid layer, albeit possibly in chemically changed form.

As the activator is also included in the first liquid, it will typically be trapped within the first layer in a matrix formed, for example, by a polymer. The activator could also be immobilised as part of the matrix, for example, by including the activator on a molecule with a reactive group which reacts with monomer or oligomer units. The activator may be initially inactive, and become active only once the first liquid has been cured, or in response to a stimulus, or when in contact with a component of the second fluid.

The invention finds particular application in the production of layers of conductive metal as the second solid layer. Conductive metal layers are typically formed by the reduction of metal ions in a reaction involving a catalyst, a metal ion and a reducing agent. A variety of different techniques may be used, including electroless plating and the process disclosed in WO 2004/068389. One reagent of the process, typically the catalyst, is deposited on a substrate (typically by inkjet printing) in the first layer by the method of the invention, and other necessary reagents deposited (by inkjet printing, immersion or otherwise) in the second fluid (and possibly in one or more other vehicles) resulting in reaction to form a conductive metal layer constituting the second solid layer.

In embodiments of the invention where the second layer is a conductive metal region, formed by the reaction of metal ions and a reducing agent, the activator conveniently comprises a metal or metal-containing material, typically a catalyst or catalyst precursor. Suitable metals include metal colloids or particles, such as colloids or particles of platinum, silver, palladium, iridium, bronze, aluminium, gold or copper. Suitable metal-containing materials include salts or complexes of a conductive metal, preferably salts of a transition metal, particularly palladium, platinum and silver. The salts may be inorganic, such as palladium chloride, or organic, for example palladium acetate or palladium propanoate. Preferred organic salts are alkanoates. The current preferred activator is palladium acetate. Desirably the weight ratio of the curable composition to the metal portion of the activator is greater than about 15:1, preferably greater than about 25:1.

A suitable solvent for the deposition of an organic acid salt of a transition metal, e.g. palladium acetate, include diacetone alcohol, a 50/50 mixture of equal parts by weight of diacetone alcohol and methoxy propanol, and a 50/50 mixture of equal parts by weight of toluene and methoxy propanol. A co-solvent is preferably included to increase viscosity to suitable levels for inkjet printing. The salt, e.g. palladium acetate, is conveniently present in an amount in the range 1 to 3% by weight, preferably about 2% by weight of the deposited liquid.

Where the activator is a catalyst or catalyst precursor, the second fluid conveniently comprises a solution of a metal ion and a reducing agent, operable to react together, activated by the activator, to form a conductive metal region on the first solid layer. Preferably, the composition of the second fluid is such that it does not react spontaneously, but reacts only once it has been brought into contact with the activator present in the first solid layer. The second fluid may further comprise pH-altering reagent such as an acid or a base, to activate the reducing agent.

The metal ion, the reducing agent and the optional base/acid may be deposited in two or three separate component solutions which mix together on the substrate to form a reaction solution. Further details may be as disclosed in WO 2004/068389.

Where the second layer-forming chemical reaction is to be a reaction between metal ions and a reducing agent, to form a conductive metal region, instead of being a catalyst or catalyst precursor, the activator may be one or more of metal ions, reducing agent or a pH altering reagent such as an acid or base. The second fluid will be such that a second-layer-forming reaction begins when the second fluid is in contact with the first layer. Where the activator comprises metal ions, typically as metal salts or metal complexes (and perhaps also acid/base), the second fluid may comprise reducing agent, possibly with appropriate pH adjusting reagent, e.g. a base in the case of formaldehyde. The second fluid may also contain additional ions of the same or a different metal. The activator could be metal particles or colloids. Where the activator comprises a reducing agent (and perhaps also base or acid), the second fluid will preferably comprise metal ions, typically as metal salts or metal complexes. The second fluid may comprise further reducing agent which may be the same or different to the first reducing agent. It may be appropriate to use a more powerful reducing agent such as DMAB (dimethylamineborane) initially followed by a less powerful reducing agent such as formaldehyde which gives a more pure, higher conductivity metal layer. Where the activator comprises pH altering reagent, the second fluid typically includes metal ions and reducing agent, and optionally further pH altering reagent.

The metal ion may be an ion of any conductive metal, particularly a transition group metal. Preferred conductive metals include copper, nickel, silver, gold, cobalt, a platinum group metal, or an alloy of two or more of these materials. The conductive metal may include non-metallic elements, for example, the conductive metal may be nickel phosphorus.

The metal ion is typically in the form of a salt, for example copper sulphate. The metal ion might instead be present in a complex such as with EDTA (ethylene diamine tetra acetic acid) or cyanide.

Examples of appropriate reducing agents are formaldehyde, glucose or most other aldehydes, or sodium hypophosphites, or glyoxylic acid or DMAB (dimethylamineborane).

Optionally, the substrate is preheated before the first liquid is deposited thereon. This causes the liquid to dry rapidly and spread less, achieving thinner lines. For example, a Melinex polyester substrate (Melinex is a Trade Mark) may be heated with air at 350° C. for 4 seconds using a hot air gun.

Preferably, the first liquid is deposited onto the substrate by inkjet printing. The second fluid may be deposited on the first layer by inkjet printing or other techniques. Where the first liquid and/or resulting first layer are patterned, the second fluid may be deposited according to the same pattern.

As inkjet printing processes are typically digitally controlled, different patterns can be applied using the same apparatus to different substrates. This is particularly important for the production of one-off products, customised products, or a series of uniquely identifiable products.

The substrate may be selected from a wide range of possibilities, including plastics, ceramics, natural materials, fabrics etc. In embodiments where the second layer is a conductive metal, suitable substrates include plastics materials and fabrics, e.g. in the form of sheets. A substrate might be a material having thereon electrical components, such as conductive, semi-conductive, resistive, capacitive, inductive, or optical materials, such as liquid crystals, light emitting polymers or the like. As noted above, the method of the invention need not involve significant heating and so may be used with a wide range of substrates, including heat-sensitive plastics materials. The method may include the step of depositing one or more of said electrical components on the substrate, preferably by inkjet printing, prior to forming a conductive metal region on the resulting substrate.

Similarly, the method may further include the step of depositing an electrical component onto the resulting conductive metal region, building up complex devices. Said further deposition step may also be carried out using inkjet printing technology.

The invention finds particular application in printing of batteries. A battery may be formed on a substrate by forming two regions of different conductive metals on a substrate by the method of the invention, and electrolytically connecting the two regions by way of an electrolyte (which may be inkjet printed), thereby forming an electrochemical cell. A plurality of electrochemical cells may be electrically connected in series or in parallel thereby increasing the voltage and/or current available. The invention also covers a method of forming a battery by forming two regions of different conductive metals on a substrate by the method of the invention and electrolytically connecting the two regions by way of an electrolyte (which may be inkjet printed). The invention also extends to a battery formed by the said method.

Thus, the method can be used as one stage in the fabrication of electrical items. It is particularly appropriate for use in manufacturing electrical items which involve complex patterns, such as displays which include complex patterns of pixels. Other applications include the fabrication of aerials or antenna for car radios, mobile phones, and/or satellite navigation systems; radio frequency shielding devices; edge connectors, contact and bus connectors for circuit boards; radio frequency identification tags (RFID tags); conductive tracks for printed circuit boards, including flexible printed circuit boards; smart textiles, such as those including electrical circuits; decorations; vehicle windscreen heaters; components of batteries and/or fuel cells; ceramic components; transformers and inductive power supplies, particularly in miniaturised form; security devices; printed circuit board components, such as capacitors and conductors; membrane keyboards, particularly their electrical contacts; disposable, low cost electronic items; electroluminescent disposable displays; biosensors, mechanical sensors, chemical and electrochemical sensors.

The method also finds application in producing an electrical connection between two components in or for a circuit.

The method may also be used to produce decorative features.

The method may include the further step of forming an additional metal layer onto a conductive metal region constituted by the second layer, e.g. by electrolytic or electroless plating or by immersion metallisation.

Where the first liquid, and/or the second liquid, are inkjet printed, the respective liquids should fulfil the specific requirements of inkjet printing inks as regards viscosity, surface tension, conductivity, pH, filtration, particle size and ageing stability. One or more humectants may be added to one or more component solutions to reduce evaporation. The particular values of these properties which are required are different for different inkjet technologies and suitable component solutions fulfilling these properties can readily be devised for a specific application by one skilled in the art.

The method also extends to an article prepared according to the method of the invention.

According to a further aspect of the present invention there is provided a liquid comprising a curable layer-forming composition for forming a first solid layer on the surface of a substrate, the liquid comprising an activator suitable for activating a second layer-forming chemical reaction, and one or more chemical components which are capable of undergoing a chemical reaction (typically responsive to a stimulus) causing the liquid to harden.

The invention also covers the activator liquid in combination with a second fluid.

Preferably, the one or more chemical components comprise monomers and/or oligomers which can polymerize, forming a solid first layer.

The activator is preferably a catalyst. However, the activator could comprise a chemical species which can activate the second solid layer forming chemical reaction but which is consumed or reacts in the process.

The activator may also comprise a reagent, or a plurality of reagents which, when brought into contact with a second liquid comprising components (preferably other components) of a second layer-forming chemical reaction, undergo a chemical reaction leading to formation of a second layer on the first solid layer.

Suitable solvents for the deposition of an organic acid salt of a transition metal include diacetone alcohol, mixtures of equal amounts by weight of diacetone alcohol and methoxypropanol, and mixtures of equal amounts by weight of toluene and methoxypropanol. A co-solvent is preferably included to increase viscosity to suitable levels for inkjet printing. Preferably the organic acid salt of a transition metal constitutes 1-3% by weight of palladium acetate, most preferably 2% by weight of the deposited liquid. An equivalent concentration of another organic acid salt of a transition metal can be employed.

Preferred features of the layer-forming activator solution are as discussed above.

In a further aspect of the present invention there is provided a method of forming on the surface of a substrate a first layer which is suitable for activating a second solid layer-forming chemical reaction thereon, the method comprising the steps of: applying a curable liquid to the surface of the substrate, the curable liquid comprising an activator for a layer-forming chemical reaction; and curing the curable liquid, thereby forming a first solid layer on the surface of the substrate, capable of activating a second solid layer-forming chemical reaction.

The invention also extends to a method of forming a solid layer on a substrate, comprising the steps of: applying a curable liquid to the surface of the substrate, the curable liquid comprising an activator for a layer-forming chemical reaction; curing the curable liquid, thereby forming a first solid layer on the surface of the substrate, capable of activating a second solid-layer-forming chemical reaction thereon; and bringing into contact with the first solid layer a second liquid comprising components of a second solid-layer-forming chemical reaction, activated by the activator, thereby causing a second solid layer to be formed on the first solid layer.

The invention will be further described, by way of illustration, in the following Examples. In the Examples all percentages are percentages by weight unless otherwise specified.

EXAMPLE 1

UV curable catalyst formulations referred to as ALF 116 and ALF 117 were prepared according to the formulation shown in Table 1 below. The monomers, oligomers and initiators used are already known from the related field of UV curable inkjet inks to have excellent curing properties and adhesion to plastic substrates. These formulations contain some solvent (diacetone alcohol and methoxy propanol) acting as a carrier liquid in which the palladium acetate catalyst is soluble. The solvent was allowed to evaporate off after application of the formulation to a Melinex (Melinex is a Trade Mark) polyester substrate surface by inkjet printing using an XJ500/180 print head from Xaar, UK. The inks were then cured by the application of UV which began a curing procedure in which the monomer and oligomer components polymerised.

TABLE 1

UV curable catalyst formulations
(Figures are percentages by weight)

| Materials | ALF 116 | ALF 117 |
|---|---|---|
| Palladium acetate | 1.25 | 0.94 |
| PVP K30 | — | 2.5 |
| Diacetone alcohol (DAA) | 24.38 | 23.28 |
| Methoxy propanol | 24.37 | 23.28 |
| Actilane 505 | 5 | 5 |
| DPHA | 1.5 | 1.5 |
| Irgacure 1700 | 3.25 | 3.25 |
| Irgacure 819 | 1.25 | 1.25 |
| DPGDA | 39 | 39 |

PVP K30 is a grade of polyvinyl pyrrolidinone supplied by ISP, Tadworth, UK. Actilane 505 is a UV-curable reactive tetrafunctional polyester acrylate oligomer supplied by Akzo Nobel UV Resins, Manchester, UK. DPHA is dipentaerythritol hexaacrylate, a UV-curable hexafunctional monomer, supplied by UCB, Dragenbos, Belgium. Igracure 819 and Igracure 1700 are UV photo-initiators supplied by Ciba Specialty Chemicals, Macclesfield, UK—Irgacure is a Trade Mark. DPGDA is dipropylene glycol diacrylate, a UV-curable reactive diluent monomer supplied by UCB, Dragenbos, Belgium. The monomers and oligomers are in liquid form. Diacetone alcohol and methoxy propanol are solvents for the palladium acetate.

PVP constitutes a water soluble (second) chemical functionality. The monomers and oligomers, Actilane 505, DPHA and DPGDA, react to form a polymer that constitutes a water insoluble (first) chemical functionality.

ALF 116 cured well (with a line speed of 40 meters/minute) to give a tough scratch resistant film. However, when a copper layer forming solution (consisting of Enplate 872A (30% w/w), Enplate 872B (30% w/w), Enplate 872C (10% w/w), t-butanol (5% w/w), ethylene glycol (20% w/w) and polyethylene glycol 1500 (5% w/w) was applied to the film, no copper was deposited. We believe that this is due to the smooth, impervious surface of the cured film, which seals the catalyst into a plastic layer and prevents it from coming into contact with the copper-layer forming solution.

Enplate 872A, 872B and 872C are copper plating solutions, available from Enthone-OMI of Woking, UK. Enplate 872A contains copper sulphate. Enplate 872B contains a cyanide complexing agent and formaldehyde. Enplate 872C contains sodium hydroxide. (Enplate is a Trade Mark.) Enplate 872 A, B and C are in common use as component solutions for electroless copper plating. Ethylene glycol is present as a humectant and acts to lower surface tension. T-butanol is a cosolvent which reduces surface tension and increases wetting. Polyethylene glycol-1500 functions as a humectant.

In contrast, ALF 117 includes a small amount (5% by weight of dried film) of polyvinylpyrrolidone, which was added to the formulation with the aim that it would dissolve out of the cured layer or swell or maintain permeability upon the subsequent addition of the aqueous copper-layer forming solution, and therefore expose the catalytic sites.

As with ALF 116, this again cured very well at 40 meters/minute and this time deposited copper (at a calculated 100 nm/minute).

Drying the substrate at 60° C. for 24 hours resulted in a material having good scratch resistance properties, as good as the scratch resistance of the best catalyst formulation we know for direct bonding of a copper-layer to a plastic substrate.

This work indicated that in order to maintain the activity of the catalyst it was necessary to have some form of water solubility, swellability, or other means to enable the second liquid to penetrate the first layer.

EXAMPLE 2

Three further formulations referred to as ALF 120, ALF 121, and ALF 124 were prepared as summarized in Table 2 below. Each of these is a variant of ALF 117 from Table 1.

TABLE 2

UV-curable catalyst formulations

|  | ALF 120 | ALF 121 | ALF 124 |
| --- | --- | --- | --- |
| Palladium acetate | 2 | 2 | 2 |
| DPGDA | 76 | 48 | 48 |
| DPHA | 3 | 3 | 3 |
| Actilane 505 | 10 | 10 | 10 |
| Irgacure 1700 | 6.5 | 6.5 | 6.5 |
| Irgacure 819 | 2.5 | 2.5 | 2.5 |
| Diacetone alcohol | — | 12.75 | 14 |
| Methoxy propanol | — | 12.75 | 14 |
| PVP K30 | — | 2.5 | — |

The formulations ALF 120, ALF 121 and ALF 124 were applied to a Melinex polyester substrate, as described above in Example 1.

These inks were cured using a Fusion UV 500 Watt lamp fitted with an H bulb (Fusion is a Trade Mark), in a single pass at 10 meters/minute. After curing the inks were treated with DMAB (dimethylamineborane) solution followed by a copper-layer forming solution consisting of Enplate 872A (30% w/w), Enplate 872B (30% w/w), Enplate 872C (10% w/w), t-butanol (5% w/w), ethylene glycol (20% w/w) and polyethylene glycol 1500 (5% w/w). No copper was deposited on ALF 120 or ALF 124. However, a good uniform layer of copper was deposited on ALF 121. This copper layer was found to have good conductivity, and good adhesion to the underlying substrate. Since no copper was deposited on ALF 120 or ALF 124 this provides further evidence that the PVP material is responsible for maintaining the activity of the catalyst, and that it is likely that this occurs via the water solubility mechanism proposed above.

EXAMPLE 3

ALF 121 was then modified further to give an ink with good properties for deposition by inkjet printing. Two such inks, referred to as ALF 125 and ALF 126b, are shown in Table 3 below.

TABLE 3

Jettable UV ink formulations

|  | ALF 125 | ALF 126b |
| --- | --- | --- |
| Palladium acetate | 2 | 2 |
| Irgacure 1700 | 3.25 | 3.25 |
| Irgacure 819 | 1.25 | 1.25 |
| DPGDA | 61 | 48 |
| DPHA | — | 3 |
| Actilane 505 | — | 10 |
| Diacetone alcohol | 15 | 15 |
| Methoxy propanol | 15 | 15 |
| PVP K30 | 2.5 | 2.5 |
| Viscosity, cPs (25° C.) | 9.59 | 11.2 |

ALF 125 and ALF 126b both showed good inkjet printing properties using a XaarJet 128-200 print head (available from Xaar of Cambridge, England) and both gave good quality copper deposition on a Melinex polyester substrate following the procedure described above in Examples 1 and 2. However, when making thicker copper samples of greater than 200 nm thickness, ALF125 blistered much more easily than ALF 126b.

This is thought to be because ALF 126b contains higher functionality materials (Actilane 505 is tetrafunctional, DPHA is hexafunctional) and so is more highly cross-linked and therefore forms a stronger, more robust film with better adhesion to the substrate.

Based on these results, it is also thought that it should be possible to replace the PVP with a water-swellable monomer such as HEMA (2-hydroxyethyl methacrylate), GMA (glyceryl methacrylate) or NVP (n-vinyl pyrrolidinone). Alternatively, a high boiling point water miscible solvent such as NMP (n-methylpyrrolidinone), ethylene glycol, diethylene glycol or glycerol could be used to keep the UV-cured layer open, and to allow penetration by the copper solution. Alternatively, a micro-porous film structure could be prepared by the use of micro-porous particles, such as silica (inorganic) or PPVP (poly polyvinyl pyrrolidinone) particles (organic).

EXAMPLE 4

ALF 126b was then modified further to give a UV-curable catalyst ink with optimised performance, known as ALF 126f. This was used to deposit a conductive copper layer on a Melinex (Melinex is a Trade Mark) polyester substrate. The composition of ALF 126f was as follows:

TABLE 4

ALF 126f jettable UV ink formulation

|  | ALF 126f |
|---|---|
| Palladium acetate | 2 |
| Irgacure 1700 | 3.25 |
| Irgacure 819 | 1.25 |
| DPGDA | 30.5 |
| DPHA | 3 |
| Actilane 505 | 10 |
| Diacetone alcohol | 47.5 |
| PVP K30 | 2.5 |
| Viscosity, cPs (25° C.) | 17.6 |

This fluid was printed with a XJ500/180 print head (available from Xaar of Cambridge, England) at 180×250 dpi. The samples were then cured under a Fusion 500 Watt H-bulb, in 4 passes of 20 meters/min each, resulting in formation of the first layer. For a line printed using a single jet, the thickness was measured at about 500 nm. For larger area coverage the layer thickness will increase, possibly up to the theoretical maximum for this printing resolution of 2.9 microns. The samples were submerged in a chemical bath containing a solution of 1.6% dimethylamineborane (DMAB) in deionised water, and processed at 40±2° C. for 2 minutes, followed by a deionised water rinse, and drying. This treatment reduced the palladium acetate to palladium metal, thus activating the catalyst. The samples were then treated with a copper layer forming solution, the solution consisting of 75% deionised water and ENPLATE Cu 872A, ENPLATE Cu 872B, and ENPLATE Cu 872C in the weight ratio 3:3:1, respectively. The samples were immersed in the copper layer forming solution under agitation for 2 minutes, while held at 45±2° C. in a temperature controlled bath.

As with ALF 126b, ALF 126f showed good inkjet printing properties and gave good quality copper deposition.

EXAMPLE 5

ALF 126f ink was coated onto a Melinex 339 (Dupont Teijin Films) polyester substrate using a 12 μm drawdown bar. The liquid film was then exposed to UV light through apertures patterned in a 25 micron aluminium foil. The UV light source was a Fusion systems F500 using an H bulb, giving a total UV dose of 0.70 J/cm². The exposed areas of the film cured and solidified. The unexposed areas remained liquid and were easily washed away using ethanol. A further four passes under the UV lamp ensured full curing.

The films were then immersed in a 1.6% solution of DMAB at 40° C. for 2 mins, washed and then placed in an electroless copper plating bath (Enplate Cu 872A, Enplate Cu 872B and Enplate Cu 872C in the weight ratio 3:3:1, respectively) at 45° C. for 2 minutes and then rinsed again in deionised water. Copper metal was plated onto the exposed regions whereas the unexposed areas remained uncoated.

EXAMPLE 6

Direct Laser Writing

Structures were directly written using the process of direct laser writing. Liquid films of ALF 126f ink of between 12 microns and 24 microns were prepared on a Melinex 339 polyester substrate (Melinex is a trademark of Dupont Teijin Films) using the draw-down method. The liquid films were immediately fed into an Orbotech DP100 SL Direct laser write system (Orbotech is a Trade Mark). This system uses a 4 W Paladin (Paladin is a Trade Mark) diode pumped solid state laser (Coherent Ltd) operating at 355 nm.

Patterns were produced using energy dosed from 20 mJ up to 100 mJ in an atmosphere of nitrogen gas (although this is not essential). The uncured areas were washed away using ethanol. The samples were then immersed in a 1.6% solution of DMAB for 2 minutes, rinsed in DI water and then plated by immersion in Enplate copper plating solution (Enplate Cu872A, Enplate Cu 872B and Enplate 872C in the weight ratio 3:3:1, respectively) for 2 minutes at 45° C. This resulted in well adhered copper features as fine as 20 microns.

The invention claimed is:

1. A liquid comprising a curable composition comprising an initiator and a mixture of acrylate or methacrylate monomers and/or oligomers, wherein at least a portion of the acrylate or methylacrylate monomers and/or oligomers have at least 3 cross-linkable functional groups; and an activator comprising a metal or metal-containing material, wherein the curable composition is capable of forming and adhering, on the surface of a substrate, a first solid layer which is capable on contact with a different liquid of forming a second layer thereon, wherein the activator is capable of activating formation of the second solid layer, and wherein the weight ratio of the curable composition to the metal portion of the activator is greater than about 25:1.

2. A liquid according to claim 1, wherein not more than 75% by weight of the total content of the acrylate or methylacrylate monomers and/or oligomers has 3 cross-linkable functional groups.

3. A liquid according to claim 1, wherein not more than 35% by weight of the total content of the acrylate or methylacrylate monomers and/or oligomers has 4 cross-linkable functional groups.

4. A liquid according to claim 1, wherein not more than 10% by weight of the total content of the acrylate or methylacrylate monomers and/or oligomers has 5 cross-linkable functional groups.

5. A liquid according to claim 1, wherein the curable composition is curable in response to electromagnetic radiation.

6. A liquid according to claim 5, wherein the curable composition is curable in response to ultraviolet radiation.

7. A liquid according to claim 1, further comprising a non-aqueous solution.

8. A liquid according to claim 1, further comprising one or more ingredients that constitute or form a first chemical functionality in the first layer, the first chemical functionality being at least partially insoluble in the different liquid.

9. A liquid according to claim 1, further comprising one or more ingredients which constitute or form a second chemical compound in the second layer, the second chemical compound being at least partially soluble, miscible or swellable in the different liquid or permeable in the different liquid.

10. A liquid according to claim 8, wherein the weight ratio of the first chemical compound to the second chemical compound is greater than about 5:1.

11. A liquid according to claim 9, wherein the second compound is polyvinylpyrrolidone.

12. A liquid according to claim 1, wherein the activator comprises a catalyst or catalyst precursor.

13. A liquid according to claim 12, wherein the activator comprises palladium.

14. A liquid according to claim 1, wherein the liquid is inkjet printable.

15. A substrate having applied to a surface thereof a liquid according to claim 1.

16. A substrate according to claim 15, wherein the applied liquid is in the form of a coating.

17. A substrate according to claim 15, in combination with the different liquid.

18. A substrate according to claim 17, wherein the different liquid comprises an aqueous solution.

19. A substrate according to claim 16, wherein the different liquid comprises metal ions and a reducing agent.

20. A substrate according to claim 18, wherein the second layer comprises a conductive metal layer.

* * * * *